(12) United States Patent
Ogura

(10) Patent No.: US 12,526,913 B2
(45) Date of Patent: Jan. 13, 2026

(54) ELECTRONIC DEVICE

(71) Applicant: HITACHI ASTEMO, LTD., Hitachinaka (JP)

(72) Inventor: Takashi Ogura, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 334 days.

(21) Appl. No.: 18/547,742

(22) PCT Filed: Sep. 29, 2021

(86) PCT No.: PCT/JP2021/036019
§ 371 (c)(1),
(2) Date: Aug. 24, 2023

(87) PCT Pub. No.: WO2022/201601
PCT Pub. Date: Sep. 29, 2022

(65) Prior Publication Data
US 2024/0306288 A1    Sep. 12, 2024

(30) Foreign Application Priority Data
Mar. 22, 2021 (JP) ................. 2021-047978

(51) Int. Cl.
*H05K 1/02* (2006.01)
(52) U.S. Cl.
CPC ......... *H05K 1/0231* (2013.01); *H05K 1/0215* (2013.01)
(58) Field of Classification Search
CPC ............. H05K 1/0231; H05K 1/0215; H05K 2201/10371; H05K 2201/0723; H05K 1/162; H05K 1/0218; H02M 1/44
(Continued)

(56) References Cited

U.S. PATENT DOCUMENTS

2011/0003622 A1\*   1/2011   Hwang .................. H05K 3/361
                                                                 455/575.1
2011/0157857 A1\*   6/2011   Matsumoto .......... H05K 1/0224
                                                                 361/803

FOREIGN PATENT DOCUMENTS

JP              10173348 A   *   6/1998   ............... H05K 5/00
JP           2000-269613 A        9/2000
(Continued)

OTHER PUBLICATIONS

International Search Report with English Translation and Written Opinion dated Dec. 28, 2021 in corresponding International Patent Application No. PCT/JP2021/036019 (8 pages).

*Primary Examiner* — Hung S. Bui
(74) *Attorney, Agent, or Firm* — Foley & Lardner LLP

(57) ABSTRACT

An electronic device includes: a control circuit board on which a control circuit is mounted; a connection wiring connected to the control circuit board; and a metal housing that houses the control circuit board and the connection wiring, in which the connection wiring includes a signal wiring layer, a first connector provided on one end side of the signal wiring layer and electrically connecting the signal wiring layer and the control circuit board, a second connector provided on the other end side of the signal wiring layer, and a ground wiring layer arranged at a predetermined interval from the signal wiring layer, and in which the ground wiring layer is electrically connected to the metal housing via the second connector, and is not electrically connected to the control circuit board in a state where the signal wiring layer and the control circuit board are electrically connected via the first connector.

6 Claims, 5 Drawing Sheets

(58) Field of Classification Search
USPC .................................................. 361/752, 799
See application file for complete search history.

(56) References Cited

FOREIGN PATENT DOCUMENTS

| | | |
|---|---|---|
| JP | 2003-318352 A | 11/2003 |
| JP | 2008-124183 A | 5/2008 |
| JP | 2009-267194 A | 11/2009 |
| JP | 2015-53758 A | 3/2015 |
| JP | 2019-141140 A | 8/2019 |

* cited by examiner

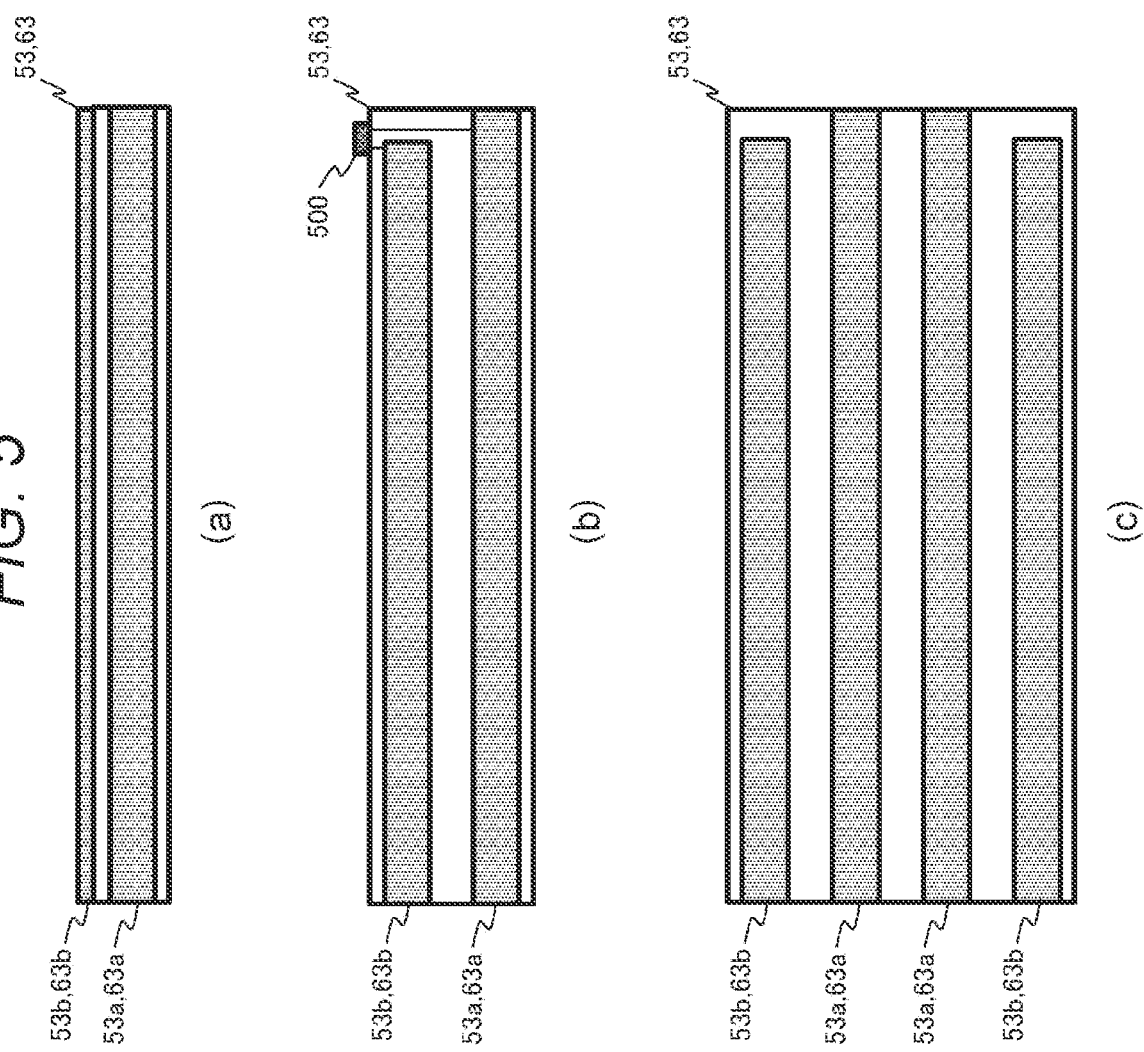

ELECTRONIC DEVICE

TECHNICAL FIELD

The present invention relates to an electronic device.

BACKGROUND ART

Conventionally, in an electronic device that is connected to an inverter and controls an operation of the inverter, when noise generated by a switching operation of the inverter is mixed in the electronic device, signal abnormality, malfunction of a circuit, or the like occurs. Therefore, it is required to appropriately protect the electronic device from noise. In addition, in recent years, there has been a strong demand for a large output and a small size of an inverter, and accordingly, a noise environment is further deteriorated. Therefore, further improvement of noise resistance in an electronic device is required.

Regarding improvement of noise resistance in an electronic device, the technique of Patent Literature 1 is known. Patent Literature 1 discloses a power conversion device in which noise countermeasure circuit components such as a capacitor and an inductor are mounted on a flexible printed wiring board that connects an external connection connector and a control circuit board.

CITATION LIST

Patent Literature

Patent Literature 1: JP 2015-53758 A

SUMMARY OF INVENTION

Technical Problem

In the power conversion device described in Patent Literature 1, the control circuit board and the capacitor of the noise countermeasure component are connected to a common metal housing via respective ground wirings. Therefore, noise may be mixed into the control circuit board via the metal housing, and sufficient noise resistance may not be obtained.

In view of the above problems, an object of the present invention is to provide an electronic device having high noise resistance.

Solution to Problem

An electronic device according to the present invention includes: a control circuit board on which a control circuit is mounted; a connection wiring connected to the control circuit board; and a metal housing that houses the control circuit board and the connection wiring, in which the connection wiring includes a signal wiring layer, a first connector provided on one end side of the signal wiring layer and electrically connecting the signal wiring layer and the control circuit board, a second connector provided on the other end side of the signal wiring layer, and a ground wiring layer arranged at a predetermined interval from the signal wiring layer, and in which the ground wiring layer is electrically connected to the metal housing via the second connector, and is not electrically connected to the control circuit board in a state where the signal wiring layer and the control circuit board are electrically connected via the first connector.

Advantageous Effects of Invention

According to the present invention, it is possible to provide an electronic device having high noise resistance.

BRIEF DESCRIPTION OF DRAWINGS

FIG. 5 is a view illustrating a modification of a wiring board.

DESCRIPTION OF EMBODIMENTS

Hereinafter, embodiments of the present invention will be described with reference to the drawings. The following description and drawings are examples for describing the present invention, and are omitted and simplified as appropriate for the sake of clarity of description. The present invention can also be carried out in various other forms. Unless otherwise specified, each component may be singular or plural.

First Embodiment

Figure 1:
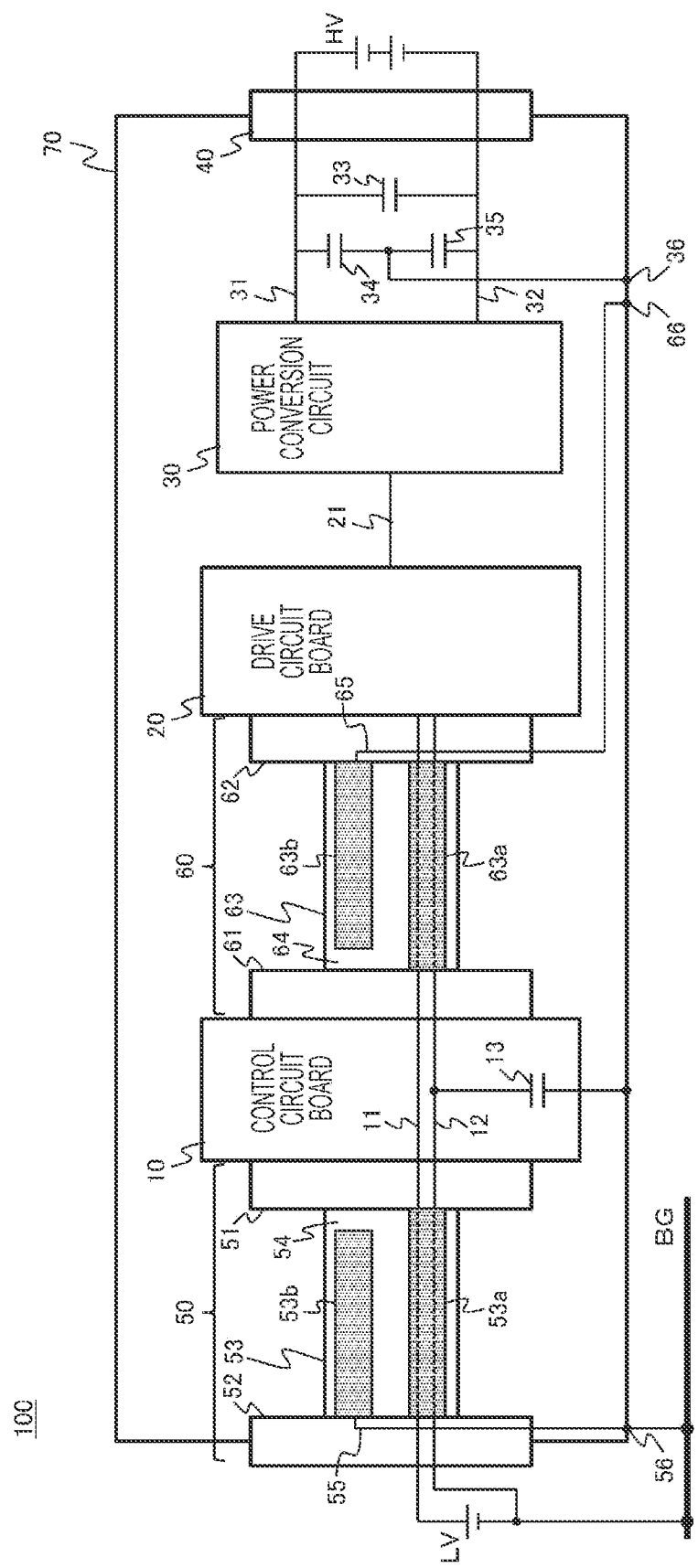
FIG. 1 is a diagram illustrating a schematic configuration of an electronic device according to a first embodiment of the present invention.

FIG. 1 is a diagram illustrating a schematic configuration of an electronic device 100 according to a first embodiment of the present invention. The electronic device 100 illustrated in FIG. 1 is mounted on a vehicle such as an electric car or a hybrid car, for example, and is connected to a motor for driving the vehicle to be used for driving control of the motor. The electronic device 100 includes a control circuit board 10, a drive circuit board 20, a power conversion circuit 30, a high-voltage connector 40, connection wirings 50 and 60, and a metal housing 70.

The control circuit board 10 executes predetermined arithmetic processing based on a command signal transmitted from an external device (not illustrated), and outputs a control signal according to the arithmetic result to the drive circuit board 20. A control circuit including a CPU, a ROM, a RAM, and the like is mounted on the control circuit board 10, and arithmetic processing for generating a control signal is performed by executing a predetermined program in the control circuit. For example, the control circuit generates a PWM signal according to a torque command as a control signal, and outputs the PWM signal to the drive circuit board 20.

The drive circuit board 20 operates according to a control signal output from the control circuit board 10, and generates a drive signal for driving the power conversion circuit 30. A drive circuit for driving the power conversion circuit 30 according to the control of the control circuit included in the control circuit board 10 is mounted on the drive circuit board 20, and a drive signal according to the control signal is generated using the drive circuit. The drive signal generated by the drive circuit is output to the power conversion circuit 30 via the gate wiring 21. For example, the drive circuit generates a gate signal from a PWM signal input as a control signal, and outputs the generated gate signal to the gate terminal of each power semiconductor element constituting the power conversion circuit 30 via the gate wiring 21.

The power conversion circuit 30 is connected to a high-voltage power supply HV via a positive electrode power supply wiring 31 and a negative electrode power supply wiring 32, and converts DC power supplied from the high-voltage power supply HV into AC power. The power conversion circuit 30 includes, for example, a plurality of power semiconductor elements, and performs conversion from DC power to AC power by switching operation of each power semiconductor element according to a gate signal output from the drive circuit. The AC power generated by the power conversion circuit 30 is output to a motor (not illustrated). As a result, the motor generates a rotational driving force, and the rotational driving force is transmitted to the driving wheels, whereby the vehicle on which the electronic device 100 is mounted travels.

The high-voltage connector 40 is a connector for connecting the high-voltage power supply HV to the positive electrode power supply wiring 31 and the negative electrode power supply wiring 32. When the high-voltage power supply HV is connected to the high-voltage connector 40, the positive electrode and the negative electrode of the high-voltage power supply HV are connected to the positive electrode power supply wiring 31 and the negative electrode power supply wiring 32, respectively. As a result, the power conversion circuit 30 and the high-voltage power supply HV are electrically connected via the positive electrode power supply wiring 31 and the negative electrode power supply wiring 32.

An X capacitor 33 and Y capacitors 34 and 35 for noise removal are connected between the positive electrode power supply wiring 31 and the negative electrode power supply wiring 32. The Y capacitor 34 and the Y capacitor 35 are electrically connected to the metal housing 70 at a connection point 36.

The connection wiring 50 includes a board connector 51, an external connector 52, and a wiring board 53.

The wiring board 53 includes a signal wiring layer 53$a$ and a ground wiring layer 53$b$, and these wiring layers are arranged to face each other at a predetermined interval. The signal wiring layer 53$a$ and the ground wiring layer 53$b$ are each formed of a material having conductivity such as copper foil, and the other portion of the wiring board 53 is formed of an insulator such as resin. Note that the wiring board 53 may be a flexible board such as a flexible printed circuit (FPC) or a rigid board such as a glass epoxy board. Alternatively, for example, a coaxial cable including a core wire corresponding to the signal wiring layer 53$a$ and a shield wire corresponding to the ground wiring layer 53$b$ may be used as the wiring board 53.

The board connector 51 is a connector for connecting the signal wiring layer 53$a$ of the wiring board 53 to the control circuit board 10, and is provided on one end side of the signal wiring layer 53$a$. By connecting the board connector 51 to the control circuit board 10, the signal line 11 and the ground line 12 provided on the control circuit board 10 are electrically connected to the signal wiring layer 53$a$ via the board connector 51. The ground line 12 is connected to the metal housing 70 via the grounding capacitor 13, whereby the control circuit board 10 is electrically grounded. Note that the control circuit board 10 may be electrically grounded by directly connecting the ground line 12 to the metal housing 70 without interposing the grounding capacitor 13. In this case, the grounding capacitor 13 is unnecessary.

In the signal wiring layer 53$a$, wiring patterns respectively corresponding to the signal line 11 and the ground line 12 are formed. When the board connector 51 is connected to the control circuit board 10, one wiring pattern is electrically connected to the signal line 11, and the other wiring pattern is electrically connected to the ground line 12. In FIG. 1, these wiring patterns are represented by broken lines in the signal wiring layer 53$a$.

Note that a gap 54 is formed between the ground wiring layer 53$b$ and the board connector 51. In the gap 54, an insulator is arranged similarly to the portion other than the signal wiring layer 53$a$ and the ground wiring layer 53$b$ of the wiring board 53. Therefore, even in a state where the signal wiring layer 53$a$ and the control circuit board 10 are electrically connected via the board connector 51, the ground wiring layer 53$b$ and the control circuit board 10 are not electrically connected. Alternatively, by not providing a connector pin that connects the ground wiring layer 53$b$ and the control circuit board 10 in the board connector 51, the ground wiring layer 53$b$ and the control circuit board 10 may not be electrically connected when the board connector 51 is connected to the control circuit board 10. In this case, it is not always necessary to form the gap 54 in the connection wiring 50.

The external connector 52 is a connector for connecting the signal wiring layer 53$a$ of the wiring board 53 to an external device and connecting the ground wiring layer 53$b$ to the metal housing 70, and is provided on the other end side of the signal wiring layer 53$a$. The external connector 52 is installed in the metal housing 70, and an external device such as a low-voltage power supply LV is connected to the external connector 52. The low-voltage power supply LV is a power supply circuit for supplying power to the control circuit board 10 and the drive circuit board 20. When the low-voltage power supply LV is connected to the external connector 52, the low-voltage power supply LV is electrically connected to the signal wiring layer 53$a$ via the external connector 52. As a result, the low-voltage power supply LV and the control circuit board 10 are electrically connected, and power is supplied from the low-voltage power supply LV to the control circuit board 10. Note that, in FIG. 1, the wiring pattern for supplying power in the signal wiring layer 53$a$ is also illustrated as a wiring pattern corresponding to the signal line 11, but these may be different wiring patterns. In addition, an external device other than the low-voltage power supply LV, for example, a host control device that transmits a command signal used for arithmetic processing of the control circuit board 10 may be connected to the external connector 52.

The external connector 52 is provided with a grounding line 55 for electrically connecting the ground wiring layer 53$b$ and the metal housing 70. The grounding line 55 is electrically connected to the metal housing 70 at a connection point 56. In the vicinity of the connection point 56, a connection point with a body ground BG formed on the vehicle body of the vehicle on which the electronic device 100 is mounted is provided. As a result, the ground wiring layer 53$b$ is connected to the metal housing 70 via the external connector 52, the ground wiring layer 53$b$ and the metal housing 70 are electrically grounded, and the impedance of the electric path from the ground wiring layer 53$b$ to the body ground BG is reduced.

The connection wiring 60 includes board connectors 61 and 62 and a wiring board 63.

The wiring board 63 has the same structure as the wiring board 53 of the connection wiring 50. That is, the wiring board 63 includes a signal wiring layer 63a and a ground wiring layer 63b, and these wiring layers are arranged to face each other at a predetermined interval. The signal wiring layer 63a and the ground wiring layer 63b are each formed of a material having conductivity such as copper foil, and the other portion of the wiring board 63 is formed of an insulator such as resin.

The board connector 61 is a connector for connecting the signal wiring layer 63a of the wiring board 63 to the control circuit board 10, and is provided on one end side of the signal wiring layer 63a. By connecting the board connector 61 to the control circuit board 10, the signal line 11 and the ground line 12 provided on the control circuit board 10 are electrically connected to the signal wiring layer 63a via the board connector 61.

In the signal wiring layer 63a, wiring patterns respectively corresponding to the signal line 11 and the ground line 12 are formed. When the board connector 61 is connected to the control 1 circuit board 10, one wiring pattern is electrically connected to the signal line 11, and the other wiring pattern is electrically connected to the ground line 12.

Similarly to the wiring board 53 of the connection wiring 50, also in the wiring board 63, a gap 64 in which an insulator is arranged is formed between the ground wiring layer 63b and the board connector 61. Therefore, even in a state where the signal wiring layer 63a and the control circuit board 10 are electrically connected via the board connector 61, the ground wiring layer 63b and the control circuit board 10 are not electrically connected.

The board connector 62 is a connector for connecting the signal wiring layer 63a of the wiring board 63 to the drive circuit board 20 and connecting the ground wiring layer 63b to the metal housing 70, and is provided on the other end side of the signal wiring layer 63a. By connecting the board connector 62 to the drive circuit board 20, the drive circuit board 20 and the signal wiring layer 63a are electrically connected via the board connector 62. As a result, the control signal output from the control circuit board 10 is input to the drive circuit board 20 via the signal wiring layer 63a, the low-voltage power supply LV and the drive circuit board 20 are electrically connected via the signal wiring layer 53a, the control circuit board 10, and the signal wiring layer 63a, and power is supplied from the low-voltage power supply LV to the drive circuit board 20. Note that, in FIG. 1, the wiring pattern for supplying power in the signal wiring layer 63a is illustrated as a wiring pattern corresponding to the signal line 11, but these may be different wiring patterns.

The board connector 62 is provided with a grounding line 65 for electrically connecting the ground wiring layer 63b and the metal housing 70. The grounding line 65 is electrically connected to the metal housing 70 at a connection point 66 provided in the vicinity of the connection point 36 described above. As a result, the ground wiring layer 63b is connected to the metal housing 70 via the board connector 62, and the ground wiring layer 63b is electrically grounded.

The metal housing 70 is a metal housing, and houses the control circuit board 10, the drive circuit board 20, the power conversion circuit 30, the high-voltage connector 40, and the connection wirings 50 and 60. As described above, the metal housing 70 is connected to the body ground BG in the vicinity of the connection point 56. As a result, the control circuit board 10 and the drive circuit board 20 and the ground wiring layers 53b and 63b of the wiring boards 53 and 63 are electrically grounded via the metal housing 70, respectively.

Next, suppression of noise propagation in the electronic device 100 according to the present embodiment will be described with reference to FIGS. 2 and 3.

Figure 2:
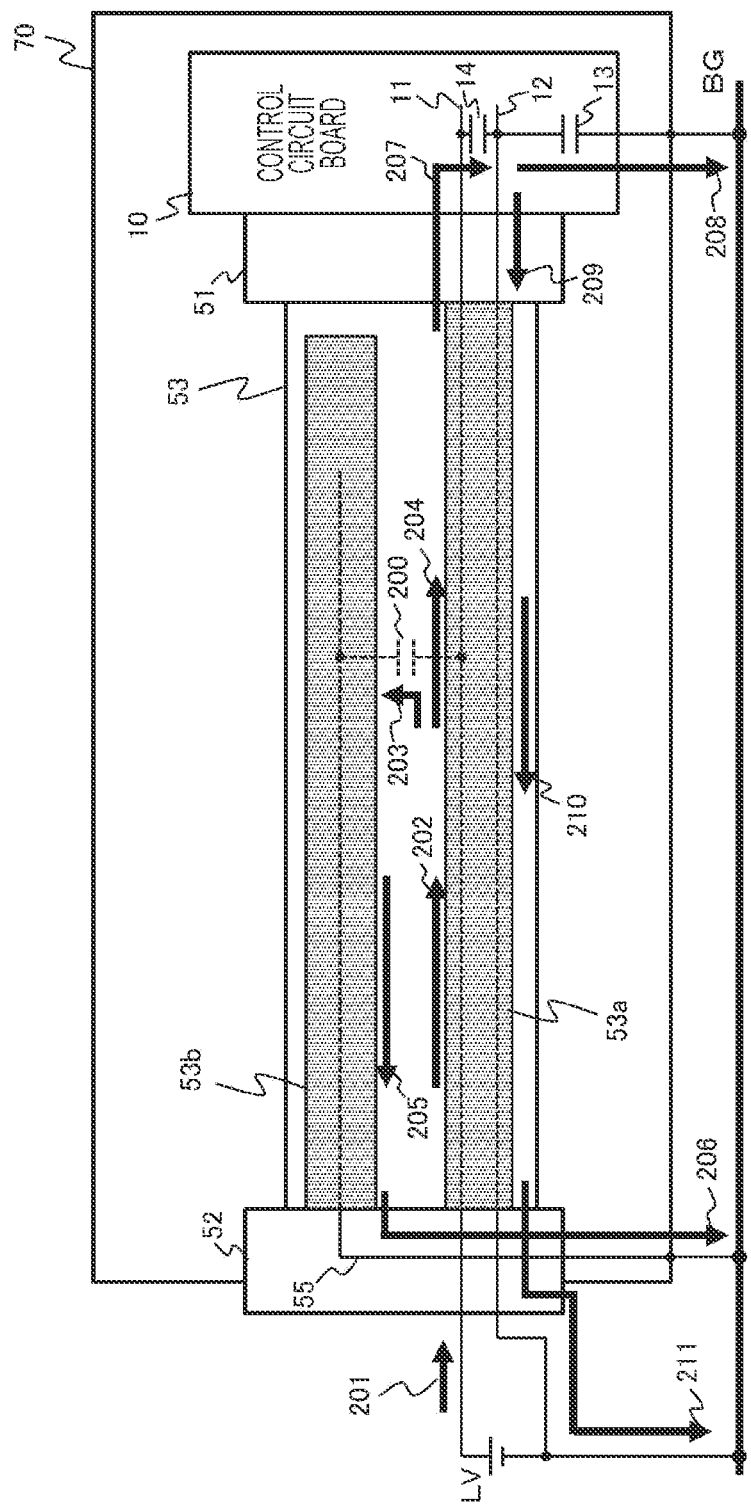
FIG. 2 is an explanatory diagram of noise propagation suppression between an external device and a control circuit board.

FIG. 2 is an explanatory diagram of noise propagation suppression between the external device and the control circuit board 10. The radio frequency noise generated in the external device enters the electronic device 100 from the external connector 52 as indicated by an arrow 201, for example. This radio frequency noise propagates through the signal wiring layer 53a as indicated by an arrow 202. Here, in the wiring board 53, the signal wiring layer 53a and the ground wiring layer 53b are arranged in parallel in a state of facing each other at a predetermined interval as described above. With this arrangement, a stray capacitance 200 is formed between the signal wiring layer 53a and the ground wiring layer 53b. Therefore, as indicated by arrows 203 and 204, the radio frequency noise propagating through the signal wiring layer 53a is divided into noise flowing into the ground wiring layer 53b via the stray capacitance 200 and noise propagating through the signal wiring layer 53a as it is.

As described above, the ground wiring layer 53b is not electrically connected to the control circuit board 10. Therefore, the radio frequency noise flowing from the signal wiring layer 53a to the ground wiring layer 53b via the stray capacitance 200 propagates through the ground wiring layer 53b and returns to the external connector 52 as indicated by an arrow 205, and passes through the grounding line 55 to the body ground BG as indicated by an arrow 206. Such a noise propagation path is hereinafter referred to as a "first noise path".

On the other hand, the radio frequency noise that has continued to propagate through the signal wiring layer 53a without flowing into the ground wiring layer 53b flows into the signal line 11 in the control circuit board 10 through the board connector 51 as indicated by an arrow 207. Then, after flowing from the signal line 11 to the ground line 12 side through a capacitive component 14 in the control circuit board 10, as indicated by arrows 208 and 209, the radio frequency noise is divided into noise flowing through the grounding capacitor 13 to the body ground BG, and noise returning to the signal wiring layer 53a. Hereinafter, a noise propagation path passing through the grounding capacitor 13 to the body ground BG will be referred to as a "second noise path".

The radio frequency noise having returned from the ground line 12 to the signal wiring layer 53a propagates through the signal wiring layer 53a and returns to the external connector 52 as indicated by an arrow 210, and flows to the body ground BG after exiting from the external connector 52 to the outside of the electronic device 100 as indicated by an arrow 211. Such a noise propagation path is hereinafter referred to as a "third noise path".

In the electronic device 100 according to the present embodiment, three types of noise paths are formed as described above for radio frequency noise entering from the outside. Here, the structures of the board connector 51, the external connector 52, and the wiring board 53 in the connection wiring 50 are determined such that the impedance of the first noise path is lower than the impedances of the second and third noise paths. As a result, the radio frequency noise flowing into the control circuit board 10 can be suppressed, and the noise resistance of the electronic device 100 can be improved.

Figure 3:
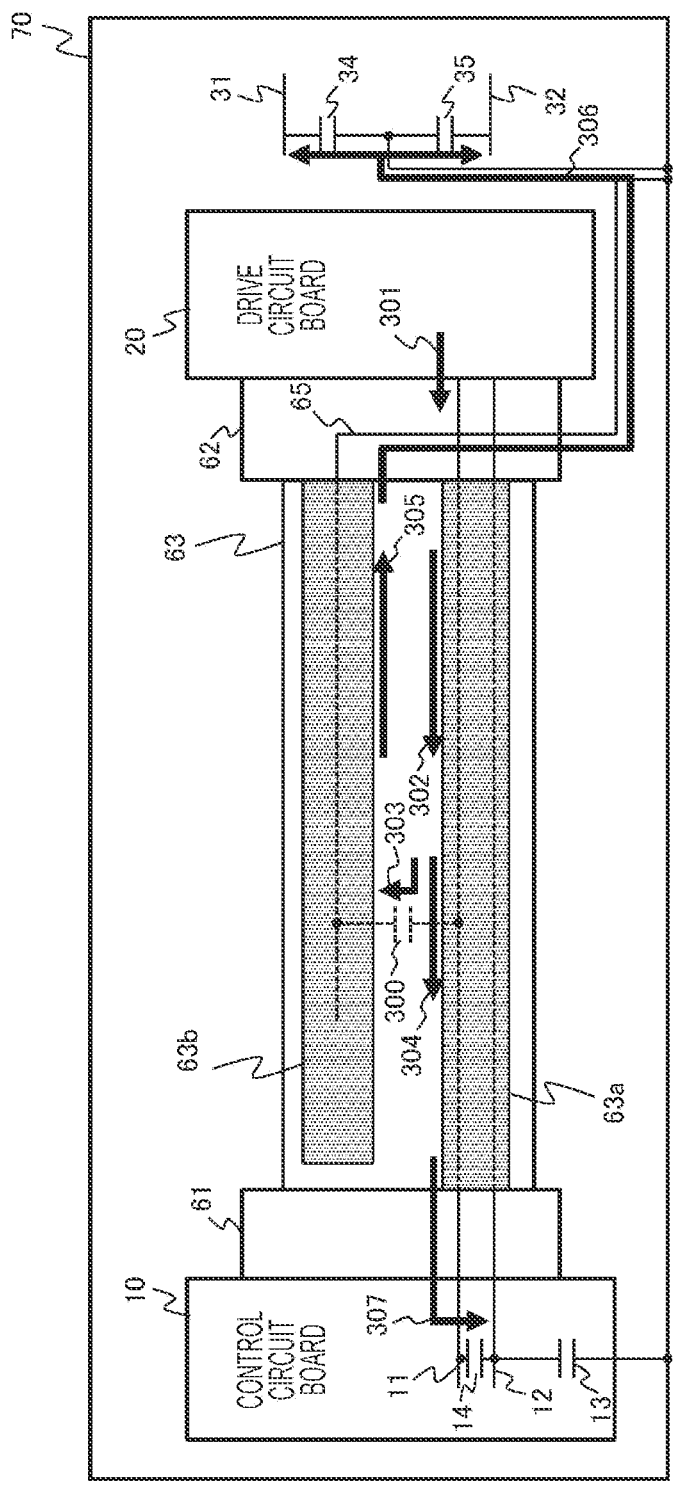
FIG. 3 is an explanatory diagram of noise propagation suppression between a drive circuit board and the control circuit board.

FIG. 3 is an explanatory diagram of noise propagation suppression between the drive circuit board 20 and the control circuit board 10. The radio frequency noise generated in the drive circuit board 20 and the power conversion circuit 30 enters the signal wiring layer 63a from the board connector 62 as indicated by an arrow 301, for example, and propagates through the signal wiring layer 63a as indicated by an arrow 302. Here, in the wiring board 63, the signal wiring layer 63a and the ground wiring layer 63b are arranged in parallel in a state of facing each other at a predetermined interval as described above. With this arrangement, similarly to the stray capacitance 200 of FIG. 2 between the signal wiring layer 53a and the ground wiring layer 53b, a stray capacitance 300 is formed between the signal wiring layer 63a and the ground wiring layer 63b. Therefore, as indicated by arrows 303 and 304, the radio frequency noise propagating through the signal wiring layer 63a is divided into noise flowing into the ground wiring layer 63b via the stray capacitance 300 and noise propagating through the signal wiring layer 63a as it is.

As described above, the ground wiring layer 63b is not electrically connected to the control circuit board 10. Therefore, the radio frequency noise flowing from the signal wiring layer 63a to the ground wiring layer 63b via the stray capacitance 300 propagates through the ground wiring layer 63b and returns to the board connector 62 as indicated by an arrow 305. Then, as indicated by an arrow 306, the radio frequency noise passes through the grounding line 65 and the Y capacitors 34 and 35 to the positive electrode power supply wiring 31 and the negative electrode power supply wiring 32. Such a noise propagation path is hereinafter referred to as a "fourth noise path".

On the other hand, the radio frequency noise that has continued to propagate through the signal wiring layer 63a without flowing into the ground wiring layer 63b flows into the signal line 11 in the control circuit board 10 through the board connector 61 as indicated by an arrow 307. Further, a part of the radio frequency noise flows from the signal line 11 to the ground line 12 side through the capacitive component 14 in the control circuit board 10. Then, the part of the radio frequency noise passes through a Y capacitor (not illustrated) and the grounding capacitor 13 installed between the signal line 11 and the ground line 12 and the positive electrode power supply wiring 31 and the negative electrode power supply wiring 32, respectively, to the positive electrode power supply wiring 31 and the negative electrode power supply wiring 32. Such a noise propagation path is hereinafter referred to as a "fifth noise path".

In the electronic device 100 according to the present embodiment, two types of noise paths are formed as described above for radio frequency noise entering from the drive circuit board 20 and the power conversion circuit 30. Here, the structures of the board connector 61, the board connector 62, and the wiring board 63 in the connection wiring 60 are determined such that the impedance of the fourth noise path is lower than the impedance of the fifth noise path. As described with reference to FIG. 1, the connection point 66 at which the grounding line 65 is connected to the metal housing 70 is arranged in the vicinity of the connection point 36 at which the Y capacitors 34 and 35 are connected to the metal housing 70, so that the radio frequency noise flowing through the fourth noise path is easily collected by the Y capacitors 34 and 35. As a result, the radio frequency noise flowing into the control circuit board 10 can be suppressed, and the noise resistance of the electronic device 100 can be improved.

Second Embodiment

Next, an electronic device according to a second embodiment of the present invention will be described. In the present embodiment, a structure of an electronic device for suppressing electromagnetic noise radiated from a noise source will be described.

Figure 4:
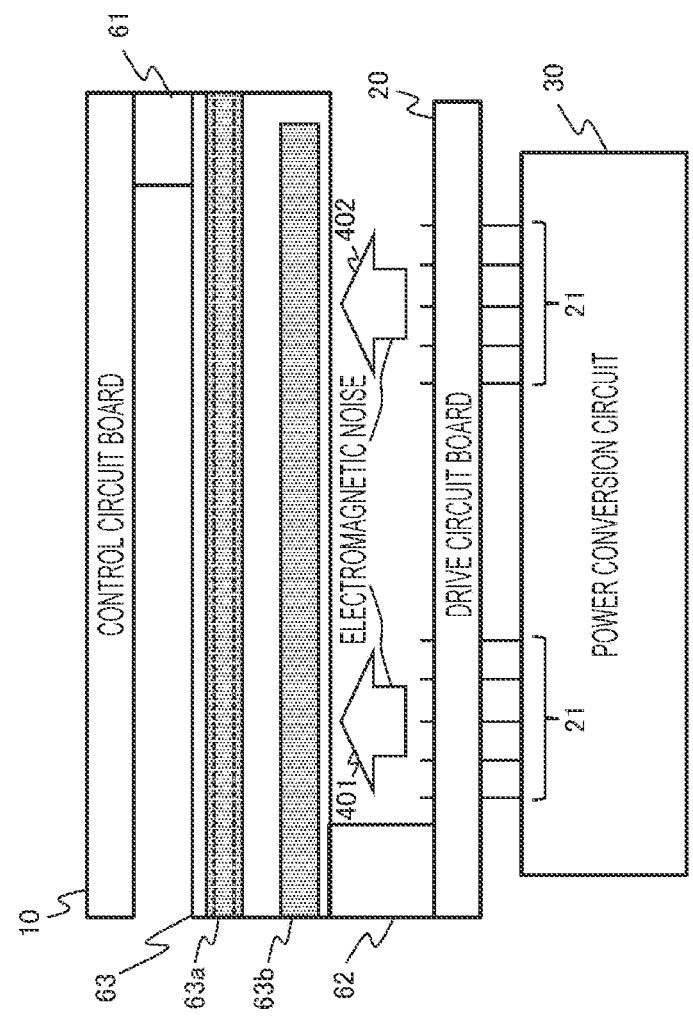
FIG. 4 is a diagram illustrating a schematic configuration of an electronic device according to a second embodiment of the present invention.

FIG. 4 is a diagram illustrating a schematic configuration of an electronic device 100A according to the second embodiment of the present invention. The electronic device 100A illustrated in FIG. 4 has the same configuration as the electronic device 100 described in the first embodiment. A drive circuit board 20 and a power conversion circuit 30 are connected via a plurality of gate wirings 21 formed in a pin shape. In FIG. 4, illustration of a high-voltage connector 40, a connection wiring 50, a metal housing 70, and a positive electrode power supply wiring 31, a negative electrode power supply wiring 32, an X capacitor 33, and Y capacitors 34 and 35 connected between the power conversion circuit 30 and the high-voltage connector 40 is omitted. In addition, illustration of grounding lines 55 and 65 provided in an external connector 52 and a board connector 62, respectively, is also omitted.

As illustrated in FIG. 4, in the electronic device 100A according to the present embodiment, a wiring board 63 is arranged between a control circuit board 10 and the drive circuit board 20 in a direction parallel to these circuit boards. In addition, the wiring board 63 is arranged such that a signal wiring layer 63a is arranged on the control circuit board 10 side and a ground wiring layer 63b is arranged on the drive circuit board 20 side. As a result, the ground wiring layer 63b is arranged between the power conversion circuit 30 and the signal wiring layer 63a.

The power conversion circuit 30 generates electromagnetic noise by switching operation of a built-in power semiconductor element. As indicated by arrows 401 and 402 in FIG. 4, the electromagnetic noise is radiated in the vertical direction through the pin-shaped gate wiring 21. However, since the ground wiring layer 63b is arranged between the power conversion circuit 30 and the signal wiring layer 63a as described above, electromagnetic noise radiated from the power conversion circuit 30 as a noise radiation circuit is shielded by the ground wiring layer 63b and can be suppressed from being transmitted to the signal wiring layer 63a and the control circuit board 10. As a result, it is possible to prevent an abnormality from occurring in the signal flowing through the signal wiring layer 63a and prevent the control circuit mounted on the control circuit board 10 from malfunctioning due to the electromagnetic noise.

(Modification)

In each of the first and second embodiments described above, the wiring boards 53 and 63 may have a structure as illustrated in FIG. 5.

For example, as illustrated in FIG. 5 (a), the ground wiring layers 53b and 63b may be formed on the surfaces of the wiring boards 53 and 63, respectively. In this case, for example, a protective film such as a conductive film covering the surfaces of the wiring boards 53 and 63 can be used as the ground wiring layers 53b and 63b.

In addition, for example, as illustrated in FIG. 5 (b), a capacitor 500 for noise countermeasures may be mounted on the wiring boards 53 and 63, and the signal wiring layers 53a and 63a and the ground wiring layers 53b and 63b may be electrically connected to each other via the capacitor 500. In this case, it is preferable that the capacitance of the capacitor 500 and the above-described stray capacitances 200 and 300 formed between the signal wiring layers 53a and 63a and the ground wiring layers 53b and 63b, respectively, are set to different capacitance values to widen the frequency band in which the noise suppression effect can be exhibited. The mounting position of the capacitor 500 is not limited to the position illustrated in FIG. 5(b), and may be another mounting position.

Furthermore, for example, as illustrated in FIG. 5 (c), the signal wiring layers 53a and 63a and the ground wiring layers 53b and 63b may each have a multilayer structure. In this case, in order to effectively suppress the radiation noise from the power conversion circuit 30 in the second embodiment, it is preferable that the ground wiring layers 53b and 63b provided in the uppermost layer and the lowermost layer of the wiring boards 53 and 63 are arranged to face each other with the signal wiring layers 53a and 63a interposed therebetween. In the example of FIG. 5 (c), the signal wiring layers 53a and 63a are formed of two layers, but the signal wiring layers 53a and 63a may be formed of three or more layers or may be formed of a single layer. In addition, the ground wiring layers 53b and 63b may be formed of three or more layers.

According to the embodiments described above, the following effects are obtained.

(1) The electronic device 100 includes the control circuit board 10 on which the control circuit is mounted, the connection wirings 50 and 60 connected to the control circuit board 10, and the metal housing 70 that houses the control circuit board 10 and the connection wirings 50 and 60. The connection wirings 50 and 60 include the signal wiring layers 53a and 63a, the board connectors 51 and 61 provided on one end sides of the signal wiring layers 53a and 63a and electrically connecting the signal wiring layers 53a and 63a and the control circuit board 10, the external connector 52 provided on the other end sides of the signal wiring layers 53a and 63a, the board connector 62, and the ground wiring layers 53b and 63b arranged at a predetermined interval from the signal wiring layers 53a and 63a. The ground wiring layers 53b and 63b are electrically connected to the metal housing 70 via the external connector 52 or the board connector 62, and are not electrically connected to the control circuit board 10 in a state where the signal wiring layers 53a and 63a and the control circuit board 10 are electrically connected via the board connectors 51 and 61. With this configuration, it is possible to form the stray capacitances 200 and 300 between the signal wiring layers 53a and 63a and the ground wiring layers 53b and 63b, respectively, and to form noise paths from the signal wiring layers 53a and 63a to the body ground BG, the positive electrode power supply wiring 31, and the negative electrode power supply wiring 32 via the stray capacitances 200 and 300 and the ground wiring layers 53b and 63b, respectively. Therefore, it is possible to provide the electronic device 100 having high noise resistance.

(2) The electronic device 100A includes the power conversion circuit 30 that acts as a noise radiation circuit that is electrically driven according to control of the control circuit to radiate electromagnetic noise. In the wiring board 63, the ground wiring layer 63b is arranged between the power conversion circuit 30, which is a noise radiation circuit, and the signal wiring layer 63a. With this configuration, it is possible to prevent a malfunction of the control circuit due to electromagnetic noise and to provide the electronic device 100A having higher noise resistance.

(3) As in the modification of FIG. 5 (c), the ground wiring layers 53b and 63b may include the first ground wiring layers 53b and 63b and the second ground wiring layers 53b and 63b arranged to face each other with the signal wiring layers 53a and 63a interposed therebetween. In this way, the radiation noise from the noise radiation circuit can be more effectively suppressed.

(4) The connector provided on the other end side of the signal wiring layer 53a is the external connector 52 that electrically connects the external device arranged outside the metal housing 70 and the signal wiring layer 53a. With this configuration, radio frequency noise entering from the external device can be effectively suppressed.

(5) The electronic device 100 includes the power conversion circuit 30 for converting DC power into AC power, and the drive circuit board 20 on which the drive circuit for driving the power conversion circuit 30 according to control of the control circuit is mounted. The board connector 62 provided on the other end side of the signal wiring layer 63a electrically connects the drive circuit board 20 and the signal wiring layer 63a. With this configuration, it is possible to effectively suppress the radio frequency noise generated in the drive circuit board 20 and the power conversion circuit 30 from entering the control circuit board 10.

(6) The electronic device 100 includes the Y capacitors 34 and 35 that act as filter capacitors for suppressing noise generated in the power conversion circuit 30. The metal housing 70 has the connection point 66 connected to the ground wiring layer 63b via the board connector 62 and the connection point 36 connected to the Y capacitors 34 and 35, and the connection point 66 is arranged in the vicinity of the connection point 36. In this way, the radio frequency noise is easily collected by the Y capacitors 34 and 35 from the signal wiring layer 63a via the stray capacitance 300 and the ground wiring layer 63b, and the noise resistance of the electronic device 100 can be further improved.

Each embodiment and various modifications described above are merely examples, and the present invention is not limited to these contents as long as the characteristics of the invention are not impaired. Although various embodiments and modifications have been described above, the present invention is not limited to these contents. Other aspects conceivable within the scope of the technical idea of the present invention are also included within the scope of the present invention.

REFERENCE SIGNS LIST 10 control circuit board
11 signal line
12 ground line
13 grounding capacitor
20 drive circuit board
21 gate wiring
30 power conversion circuit
31 positive electrode power supply wiring
32 negative electrode power supply wiring
33 X capacitor
34, 35 Y capacitor
36 connection point
40 high-voltage connector
50, 60 connection wiring
51, 61, 62 board connector
52 external connector
53, 63 wiring board
53a, 63a signal wiring layer
53b, 63b ground wiring layer
54, 64 gap
55, 65 grounding line
56, 66 connection point
70 metal housing
100, 100A electronic device
200, 300 stray capacitance
The invention claimed is:

1. An electronic device comprising:
a control circuit board on which a control circuit is mounted;
a connection wiring connected to the control circuit board; and
a metal housing that houses the control circuit board and the connection wiring,
wherein the connection wiring includes a signal wiring layer, a first connector provided on one end side of the signal wiring layer and electrically connecting the signal wiring layer and the control circuit board, a second connector provided on another end side of the signal wiring layer, and a ground wiring layer arranged at a predetermined interval from the signal wiring layer, and
wherein the ground wiring layer is electrically connected to the metal housing via the second connector, and is not electrically connected to the control circuit board in a state where the signal wiring layer and the control circuit board are electrically connected via the first connector.

2. The electronic device according to claim 1, further comprising a noise radiation circuit that is electrically driven according to control of the control circuit to radiate electromagnetic noise,
wherein the ground wiring layer is arranged between the noise radiation circuit and the signal wiring layer.

3. The electronic device according to claim 1, wherein the ground wiring layer includes a first ground wiring layer and a second ground wiring layer arranged to face each other with the signal wiring layer interposed therebetween.

4. The electronic device according to claim 1, wherein the second connector is an external connector that electrically connects an external device arranged outside the metal housing and the signal wiring layer.

5. The electronic device according to claim 1, further comprising:
a power conversion circuit for converting DC power into AC power; and
a drive circuit board on which a drive circuit for driving the power conversion circuit according to control of the control circuit is mounted,
wherein the second connector electrically connects the drive circuit board and the signal wiring layer.

6. The electronic device according to claim 5, further comprising a filter capacitor for suppressing noise generated in the power conversion circuit,
wherein the metal housing has a first connection point connected to the ground wiring layer via the second connector and a second connection point connected to the filter capacitor, and
wherein the first connection point is arranged near the second connection point.

* * * * *